(12) United States Patent
Kodama (10) Patent No.: US 6,577,153 B2
(45) Date of Patent: Jun. 10, 2003

(54) SEMICONDUCTOR INTEGRATED CIRCUIT (75) Inventor: Hidetaka Kodama, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/778,890

(22) Filed: Feb. 8, 2001

(65) Prior Publication Data

US 2002/0005557 A1 Jan. 17, 2002

(30) Foreign Application Priority Data

Jul. 12, 2000 (JP) ........................................ 2000-210762

(51) Int. Cl.[7] .............................................. H03K 17/16
(52) U.S. Cl. ............................ 326/27; 326/33; 326/82
(58) Field of Search ............................. 326/26, 27, 82, 326/83, 80, 81, 33, 34

(56) References Cited

U.S. PATENT DOCUMENTS 5,486,774 A * 1/1996 Douseki et al. ............... 326/81
6,208,170 B1 * 3/2001 Iwaki et al. ................. 326/121
6,222,410 B1 * 4/2001 Seno .......................... 327/293
6,310,491 B1 * 10/2001 Ogawa ........................ 326/113

FOREIGN PATENT DOCUMENTS

JP    2000-101418    4/2000

* cited by examiner

Primary Examiner—Don Phu Le
(74) Attorney, Agent, or Firm—Volentine Francos, PLLC (57) ABSTRACT

In a semiconductor integrated circuit having an LVT (low threshold voltage) block and an HVT (high threshold voltage) block, a power switch controls power supply to the LVT block. An output wrapper fixes a level of an output signal from the LVT block to a predetermined level when no power is supplied to the LVT block, and an input wrapper fixes a level of an input voltage inputted into the LVT block to a predetermined level when no power is supplied to the LVT block. As a result, low current consumption can be realized and malfunctions can be prevented in a power-down mode.

4 Claims, 9 Drawing Sheets

SEMICONDUCTOR INTEGRATED CIRCUIT

BACKGROUND OF THE INVENTION

1. Field of the Invention

The present invention relates to a semiconductor integrated circuit. The present invention particularly relates to a semiconductor integrated circuit, such as a system LSI installed in a portable equipment, which is required to have good speed performance while the circuit operates and to consume less power while the circuit does not operate.

2. Description of the Related Art

Conventionally, a semiconductor integrated circuit is realized by combining transistors such as a PMOS transistor, an NMOS transistor and the like. To operate an inverter circuit at high speed with transistors having the same size, it is most effective to set the threshold voltages of the transistors at a low value, or about 0.2 V compared with a normal threshold voltage of about 0.6 V.

However, if the threshold voltage is set low, a leak current occurs even while a gate is turned off and power consumption increases in an inoperative state. Due to this, the following measures have been conventionally proposed.

Figure 14:
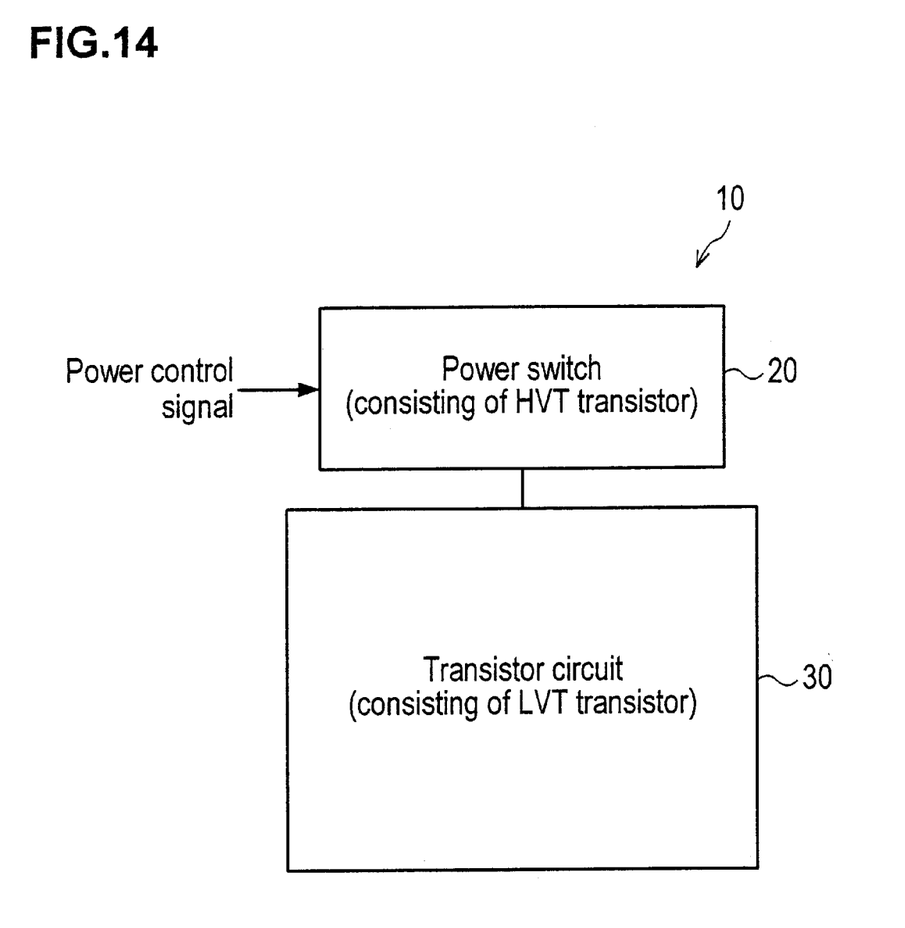
FIG. 14 is a block diagram of an MTCMOS circuit 10.

FIG. 14 is a block diagram of a conventional semiconductor integrated circuit 10. As shown in FIG. 14, the semiconductor integrated circuit 10 has an MTCMOS (Multi-Threshold-Voltage CMOS) configuration in which an element having a high threshold voltage for power supply, i.e., a power switch 20 employing an element in which no leak current flows even when a gate is turned off, is attached to the power supply line of a transistor circuit 30, to thereby stop supplying power in an inoperative state.

Although a problem does not specially occur to an LSI circuit constituted by a block consisting of an element having a low threshold voltage (to be referred to as 'LVT block' hereinafter), an LSI circuit, such as a system LSI, constituted by a mixture of an element having a high threshold voltage (to be referred to as 'HVT block' hereinafter) and an LVT block is encountered by the following disadvantage. When no power is supplied to the LVT block, i.e., the LVT block is not actuated, the output of the LVT block has a high impedance. Following this, the input signal of the HVT block which is operating has a high impedance, as well, which disadvantageously causing the HVT block to malfunction or causing considerable power consumption.

SUMMARY OF THE INVENTION

The present invention has been made in view of the above-stated problems with the conventional semiconductor integrated circuit. It is, therefore, an object of the-present invention to provide a novel, improved semiconductor integrated circuit capable of realizing low current consumption while the integrated circuit is not actuated in the LSI circuit constituted by a mixture of the HVT block and the LVT block.

To obtain the above object, according to the first aspect of the present invention, there is provided a semiconductor integrated circuit having a mixture of elements having different threshold voltages, comprising: means for controlling power supplied to an LVT block; means for fixing an level of an output signal from the LVT block to a predetermined level when no power is supplied to the LVT block; and means for fixing a level of an input voltage inputted into the LVT block to a predetermined level when no power is supplied to the LVT block. Here, the means for fixing the level of the input voltage inputted into the LVT block to a predetermined level can be dispensed with, depending on the circuit arrangement of the LVT block.

The level of the output signal can be set at a value of GND, VDD or a value outputted just before power supplied to the LVT block is stopped. The input voltage preferably has a high impedance.

Further, according to the second aspect of the present invention, there is provided a semiconductor integrated circuit having a mixture of elements having different threshold voltages, comprising: means for controlling power supplied to an LVT block; means for fixing a level of an output signal from an HVT block to a predetermined level when no power is supplied to the LVT block; and means for fixing a level of an input voltage inputted into the HVT block to a predetermined level when no power is supplied to the LVT block. Here, the means for fixing the level of the output signal from the HVT block to a predetermined level can be dispensed with, depending on the circuit arrangement of the LVT block.

The level of the input signal can be set at a value of GND, VDD or a value inputted into the HVT block just before power supplied to the LVT block is stopped. The output signal preferably has a high impedance.

With the above-stated constitution, a semiconductor integrated circuit capable of preventing the HVT block from malfunctioning and preventing high power consumption even in a state in which the power supplied to the LVT block is stopped, is provided.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

The preferred embodiments of a semiconductor integrated circuit according to the present invention will be described hereinafter with reference to the accompanying drawings. It is noted that constituent elements having substantially the same functions and constitutions will be denoted by the same reference symbols throughout the specification and drawings, to avoid repetitive description.

First Embodiment

Figure 1:
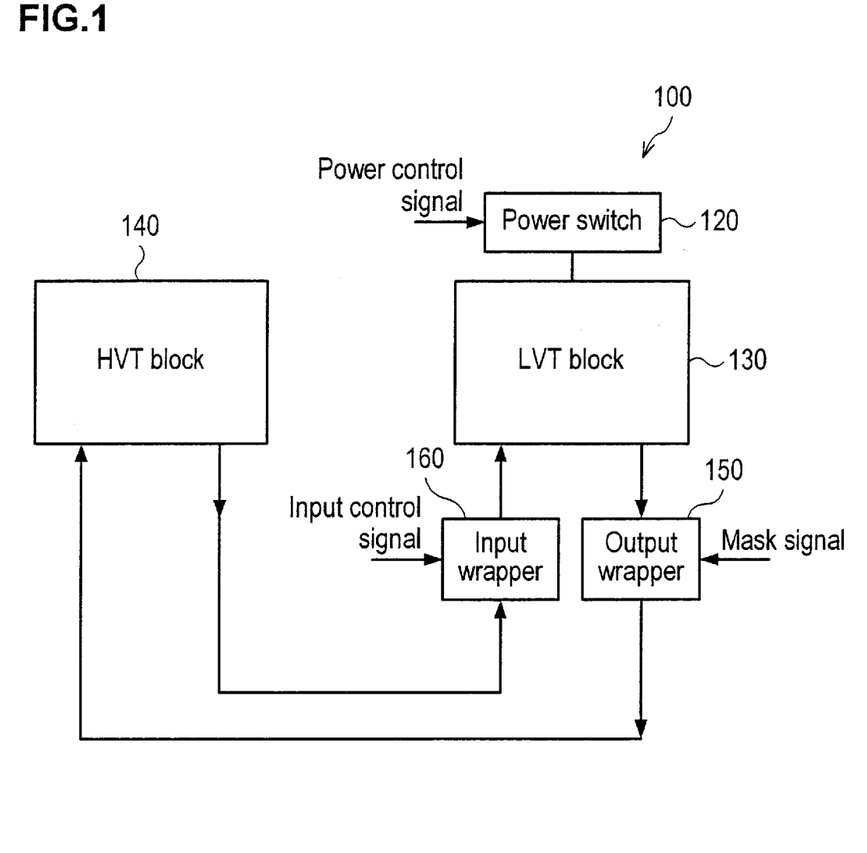
FIG. 1 is a block diagram of a semiconductor integrated circuit 100 in the first embodiment according to the present invention.

FIG. 1 is a block diagram of a semiconductor integrated circuit 100 in the first embodiment according to the present invention. As shown in FIG. 1, the semiconductor integrated circuit 100 has a power switch 120, an LVT block 130, an HVT block 140, an output wrapper 150 and an input wrapper 160.

The power switch 120 supplies power to the LVT block 130. The output wrapper 150 fixes an output level of the LVT block while the LVT block is not actuated. The input wrapper 160 does not input level to the LVT block while the LVT block is not actuated to set the LVT block to have a high impedance. This constitution allows preventing the HVT block from malfunctioning and reducing current consumption while the LVT block is not actuated.

Figure 2:
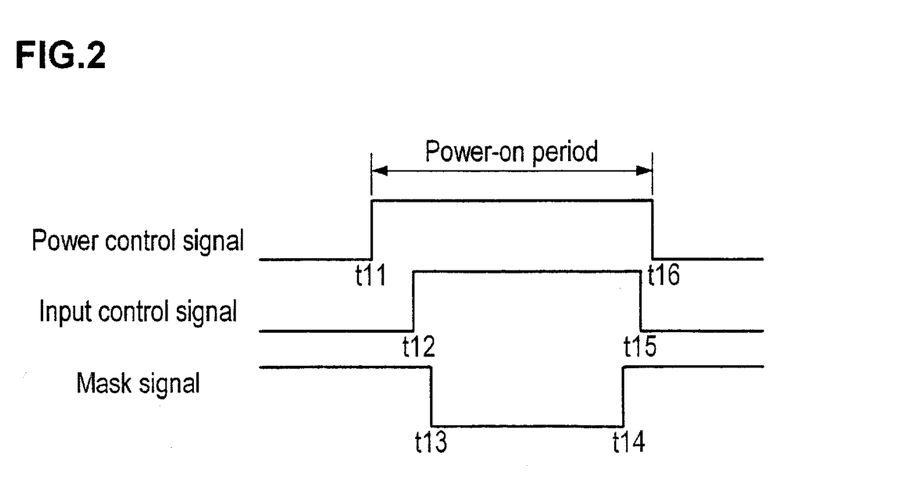
FIG. 2 shows a sequence for changing modes in the first embodiment according to the present invention.

The operation of the semiconductor integrated circuit 100 will be described with reference to FIG. 2. FIG. 2 shows a sequence for changing modes in the semiconductor integrated circuit 100. First, a return operation from a power-down mode will be described.

The power control signal of the power switch 120 is turned on to supply power to the LVT block 130 (at a time t11). The input control signal of the input wrapper 160 is turned on to make an input signal received by the LVT block (at a time t12).

If it is necessary to conduct a power-on reset operation to the LVT block 130, the reset operation is conducted. Then, the mask signal of the output wrapper 150 is turned off to make the output signal of the LVT block 130 transmittable (at a time t13). Following this, a normal operation is conducted.

Next, an operation for moving to the power-down mode will be described. The mask signal of the output wrapper 150 is turned on and the level of an output from the LVT block 130 is fixed to a predetermined level (at a time t14).

At the same time, the input control signal of the input wrapper 160 is turned off to set an input signal inputted into the LVT block 130 to have a high impedance (at a time t15). Thereafter, the power control signal of the power switch 120 is turned off to stop the supply of power to the LVT block 130 (at a time t16).

As described above, according to this embodiment, the input wrapper 160 and the output wrapper 150 which operate as stated above, are connected to the LVT block 130, whereby the level of an output from the LVT block 130 can be fixed to a predetermined level and an input signal inputted to the LVT block 130 can be set to have a high impedance even in the power-down mode in which no power is supplied to the LVT block 130. Thus, it is possible to prevent the HVT block 140 which operates even in the power-down mode from malfunctioning.

Further, since the input level of the HVT block 140 becomes a high impedance and no current, therefore, flows in an input section, it is possible to reduce current consumption. Besides, since this current also serves as a trigger for latching up the LSI circuit, it is possible to prevent latching up the LSI circuit.

Second Embodiment

Figure 3:
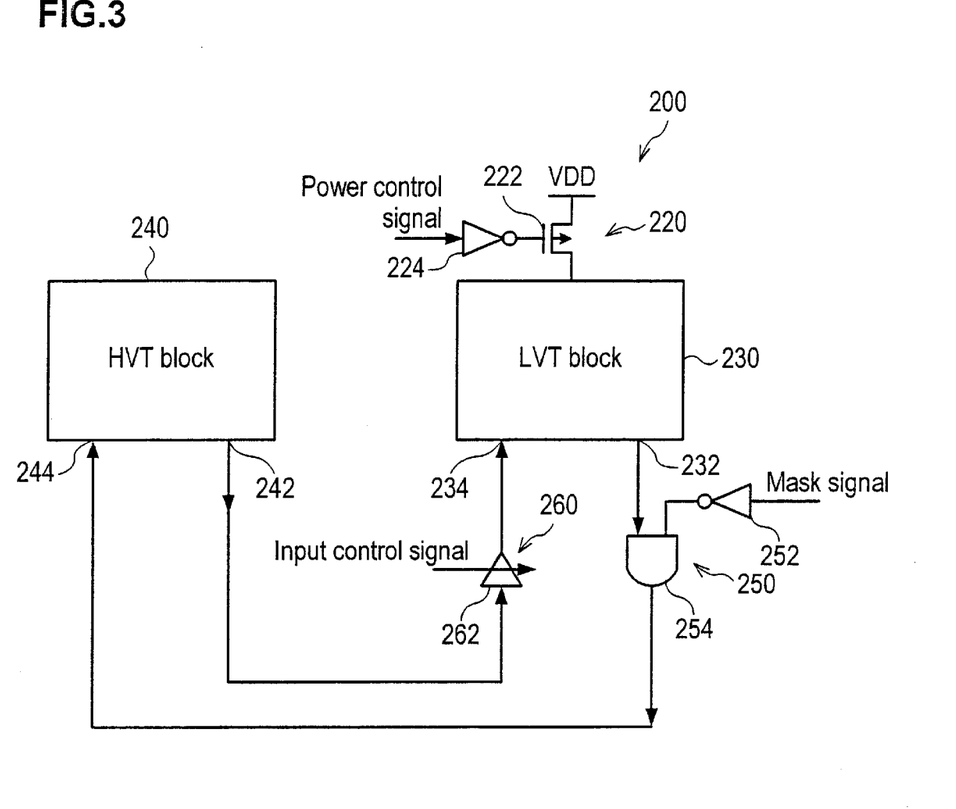
FIG. 3 is a block diagram of a semiconductor integrated circuit 200 in the second embodiment according to the present invention.

FIG. 3 is a block diagram of a semiconductor integrated circuit 200 in the second embodiment according to the present invention. As shown in FIG. 3, the semiconductor integrated circuit 200 has a power switch 220, an LVT block 230, an HVT block 240, an output wrapper 250 and an input wrapper 260. The schematic constitution of the semiconductor integrated circuit 200 is the same as that of the semiconductor integrated circuit 100 in the first embodiment.

In the semiconductor integrated circuit 200, the power switch 220 is constituted by a PMOS 222 and an inverter circuit 224, the output wrapper 250 from the LVT block 230 is constituted by a two-input AND gate 254 and an inverter circuit 252, and the input wrapper 260 to the LVT block is constituted by a tri-state buffer 262, whereby it is possible to prevent the HVT block from malfunctioning and to reduce current consumption in a power-down mode.

If the output wrapper 250 from the LVT block 230 is constituted by the two-input AND gate 254 and the inverter circuit 252, the level of an output from the LVT block 230 can be fixed to a GND level when a mask signal is turned on.

Further, if the input wrapper 260 to the LVT block 230 is constituted by the tri-state buffer 262, an output has a high impedance when an input control signal is turned off. Thus, the second embodiment can obtain the same advantage as that of the first embodiment.

Third Embodiment

Figure 4:
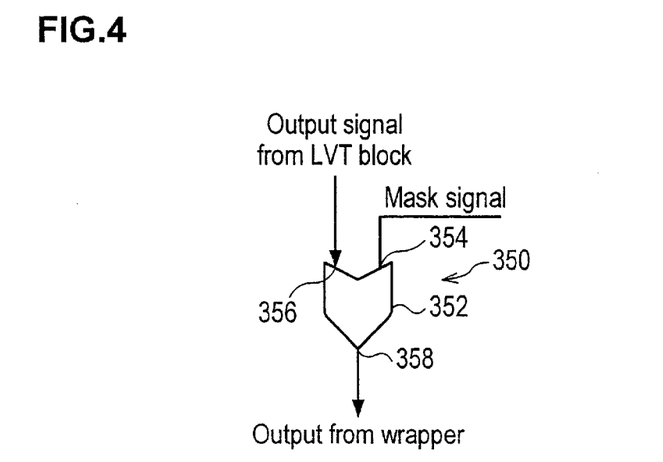
FIG. 4 shows an output wrapper 350 in the third embodiment according to the present invention.

FIG. 4 shows an output wrapper 350 in the third embodiment according to the present invention. As shown in FIG. 4, an output wrapper 350 consisting of a two-input OR gate 352 is employed in the third embodiment instead of the output wrapper 250 from the LVT block 230 in the semiconductor integrated circuit 200 in the second embodiment.

Namely, an output from the output terminal 232 of the LVT block 230 is inputted into the input terminal 356 of the two-input OR gate 352, and a mask signal is inputted into an input terminal 354. In addition, an output from the output terminal 358 of the two-input OR gate 352 is inputted into the input terminal 244 of the HVT block 240.

This embodiment is the same in constitution as the second embodiment except for the output wrapper 350 from the LVT block. Description will be, therefore, given only to that the output wrapper 350 of the LVT block can be constituted by the two-input OR gate 352.

If the output wrapper of the LVT block is constituted by the 2-input OR gate and a mask signal is turned on, then the level of an output from the LVT block can be fixed to a VDD level. This makes it possible to prevent the HVT block from malfunctioning and to reduce current consumption in a power-down mode. Thus, by adopting the constitution of this embodiment, the same advantages as those of the first and second embodiment can be obtained.

Fourth Embodiment

Figure 5:
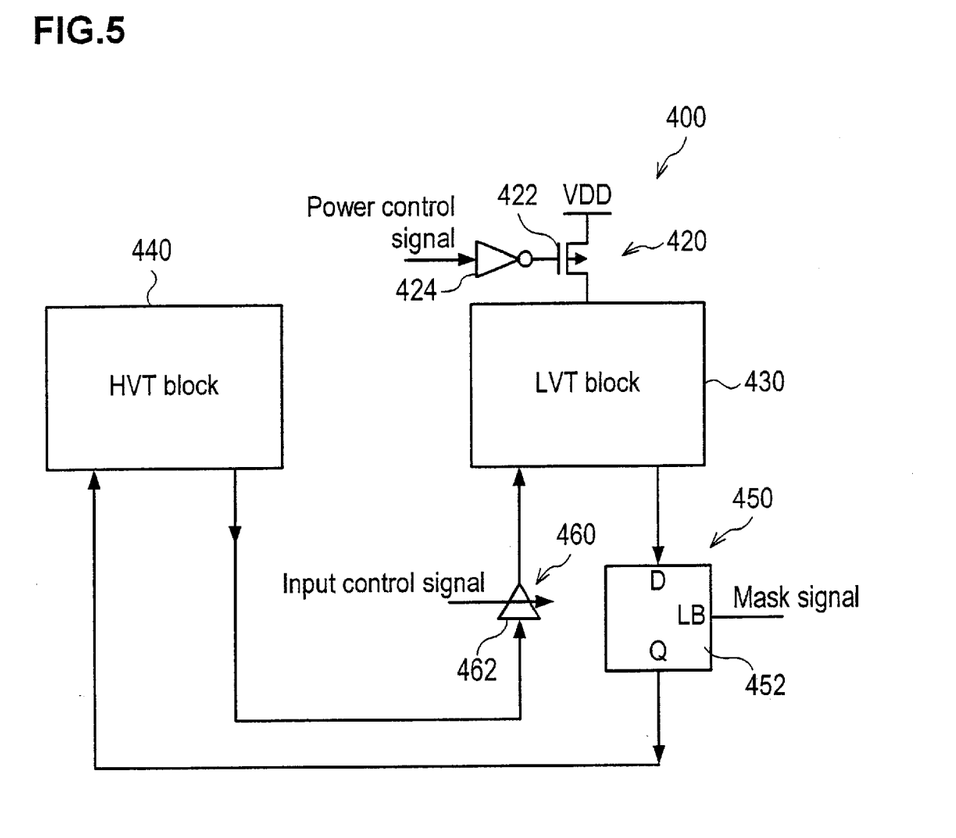
FIG. 5 is a block diagram of a semiconductor integrated circuit 400 in the fourth embodiment according to the present invention.
Figure 6:
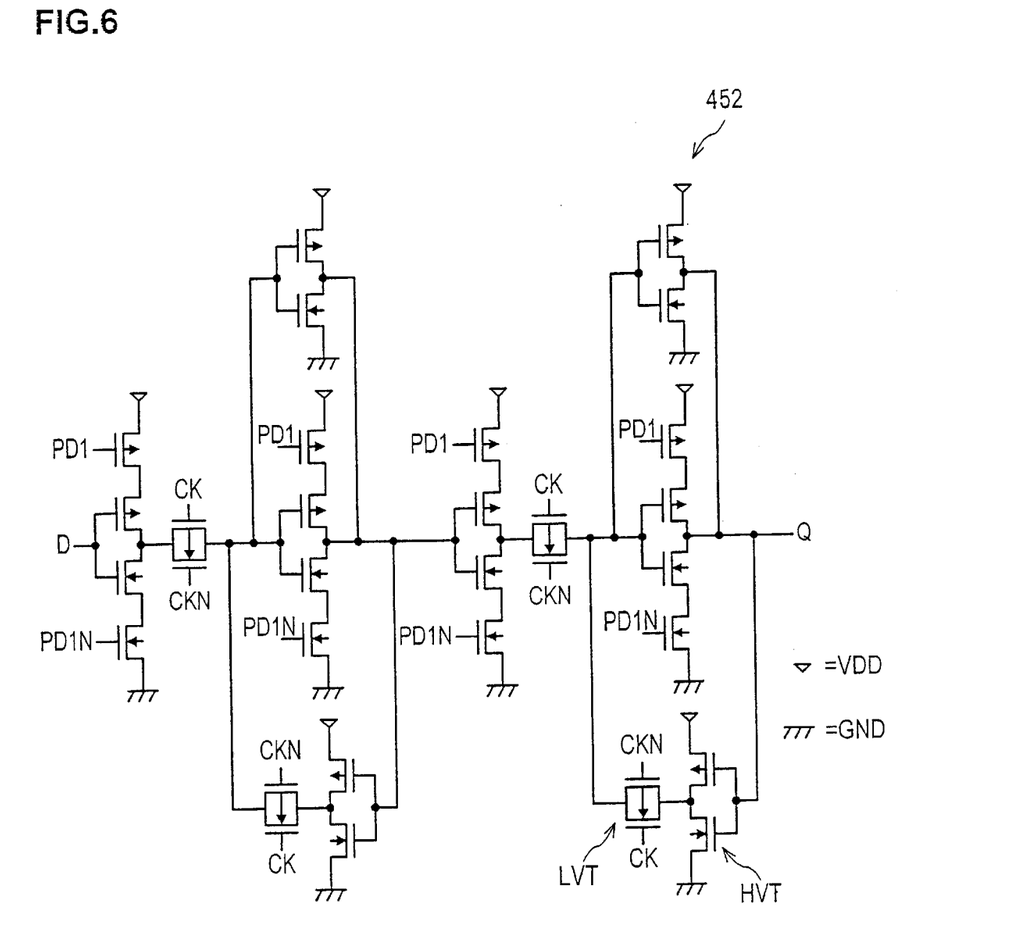
FIG. 6 is a block diagram of a flip-flop circuit capable of holding the state of data even in a power-down mode.

FIG. 5 is a block diagram of a semiconductor integrated circuit 400 in the fourth embodiment according to the present invention. FIG. 6 shows a flip-flop circuit capable of maintaining the state of data even in a power-down mode. As shown in FIG. 5, the semiconductor integrated circuit 400 has a power switch 420, an LVT block 430, an HVT block 440, an output wrapper 450 and an input wrapper 460. The schematic constitution of the semiconductor integrated circuit 400 is the same as that of the semiconductor integrated circuit 100 in the first embodiment.

In the semiconductor integrated circuit 400, the power switch 420 is constituted by a PMOS 422 and an inverter circuit 424, and the input wrapper 460 of the LVT block 430 is constituted by a tri-state buffer 462.

In addition, a data holding circuit such as a latch circuit or a flip-flop circuit within the LVT block as shown in FIG. 6 is constituted to be capable of holding data even in a power-down mode and the output wrapper 450 of the LVT block 430 is constituted by a latch circuit 452, whereby it is possible to prevent the HVT block from malfunctioning and to reduce current consumption in the power-down mode.

Figure 7:
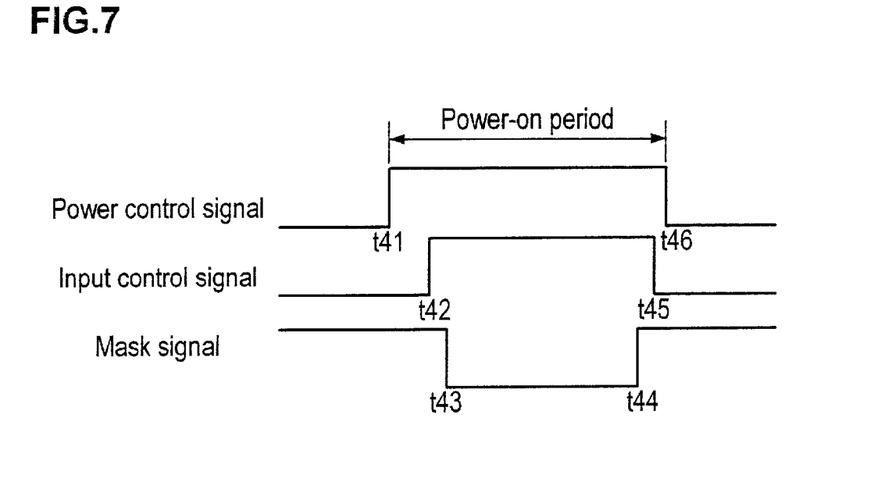
FIG. 7 shows a sequence for changing modes in the fourth embodiment according to the present invention.

Next, the operation of the semiconductor integrated circuit 400 will be described. FIG. 7 shows a sequence for changing modes. First, a return operation from a power-down mode will be described.

The power control signal of the power switch 420 is turned on to supply power to the LVT block 430 (at a time t41). At this time, the state holding circuit such as a flip-flop circuit can hold the state of data before the power-down mode even in the power-down mode as shown in FIG. 6 which illustrates one example.

The input control signal of the input wrapper 460 is turned on to allow an input signal to be received by the LVT block 430 (at a time t42). The mask signal of the output wrapper 450 is turned off to make the output signal of the LVT block 430 transmittable (at a time t43). This output wrapper 450 holds the output state of the LVT block 430 before the power-down mode. Thus, it is possible to easily return to a state before the power-down mode without conducting a reset operation. Following this, an ordinary operation is conducted.

Next, an operation for moving to the power down mode will be described. The mask signal of the output wrapper 450 is turned on and the level of an output from the LVT block 430 is fixed to a final level before the power-down mode (at a time t44).

The input control signal of the input wrapper 460 is turned off and an input signal inputted into the LVT block 430 is set to have a high impedance (at a time t45). The power control signal of the power switch 420 is turned off to stop supplying power to the LVT block 430 (at a time t46). At this time, the state holding circuit, such as the flip-flop circuit, can hold a state before the power-down mode even in the power-down mode as shown in FIG. 6 which illustrates one example.

By adopting the above-stated constitution, it is possible to obtain the same advantage as that of the first embodiment. Besides, the data holding circuit within the LVT block 430 has no change in data before and after the power-down mode and the output level of the LVT block 430 is not changed by the output wrapper 450 of the LVT block 430 before and after power-down mode. Thus, it is possible to hold the same state before and after the power-down mode.

Fifth Embodiment

Figure 8:
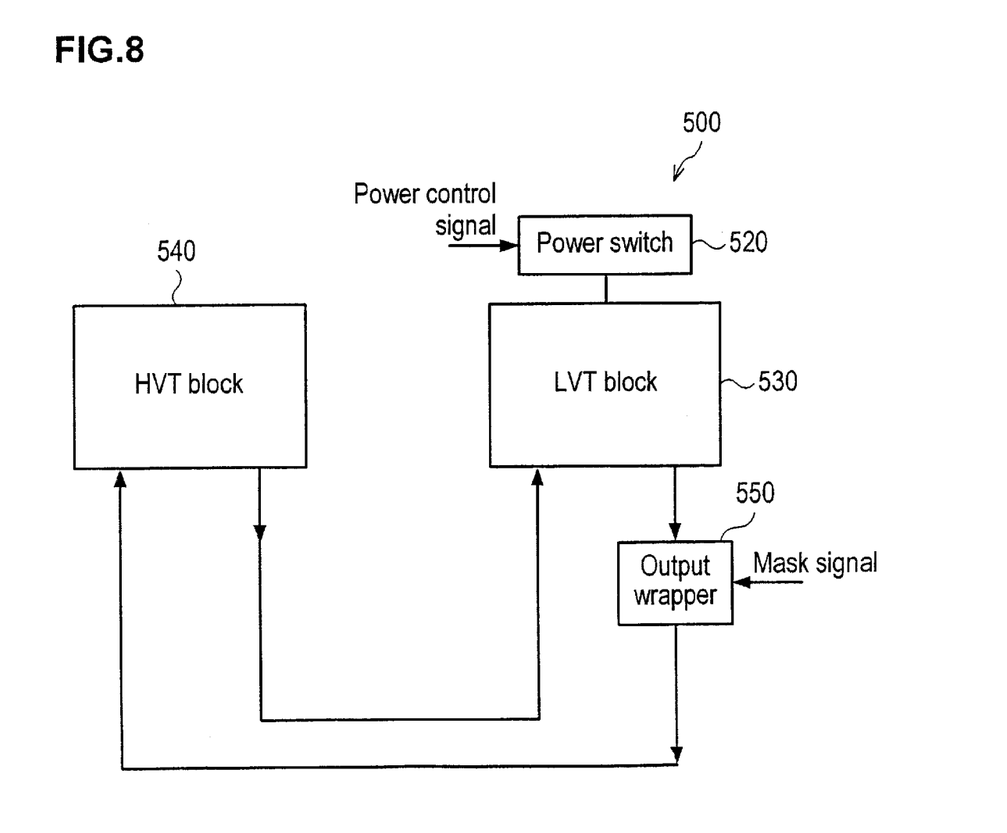
FIG. 8 is a block diagram of a semiconductor integrated circuit 500 in the fifth embodiment according to the present invention.

FIG. 8 is a block diagram of a semiconductor integrated circuit 500 in the fifth embodiment according to the present invention. As shown in FIG. 5, the semiconductor integrated circuit 500 has a power switch 520, an LVT block 530, an HVT block 540 and an output wrapper 550.

The semiconductor integrated circuit 500 in this embodiment is the same in constitution as the first embodiment except that it is not necessary to control the input wrapper to the LVT block 530. Description will be, therefore, given only to the reason the input wrapper to the LVT block 530 can be dispensed with.

It is assumed that the state of the input pin of the LVT block 530 is a so-called insulated state in which the input pin is not electrically connected to a power supply line. In a state in which the supply of power to the LVT block 530 is stopped, even if a signal level is applied to the input pin of the LVT block 530, such problems as latching up the integrated circuit and the increase of current consumption do not occur. This is because the input pin is not electrically connected to the power supply line. Therefore, if the above conditions are met, it is possible to dispense with the input wrapper to the LVT block 530 and to obtain the same advantage as that of the first embodiment.

Here, it is possible to employ the circuit arrangements as shown in, for example, the second, third and fourth embodiments for the power switch 520 and the output wrapper 550.

Sixth Embodiment

Figure 9:
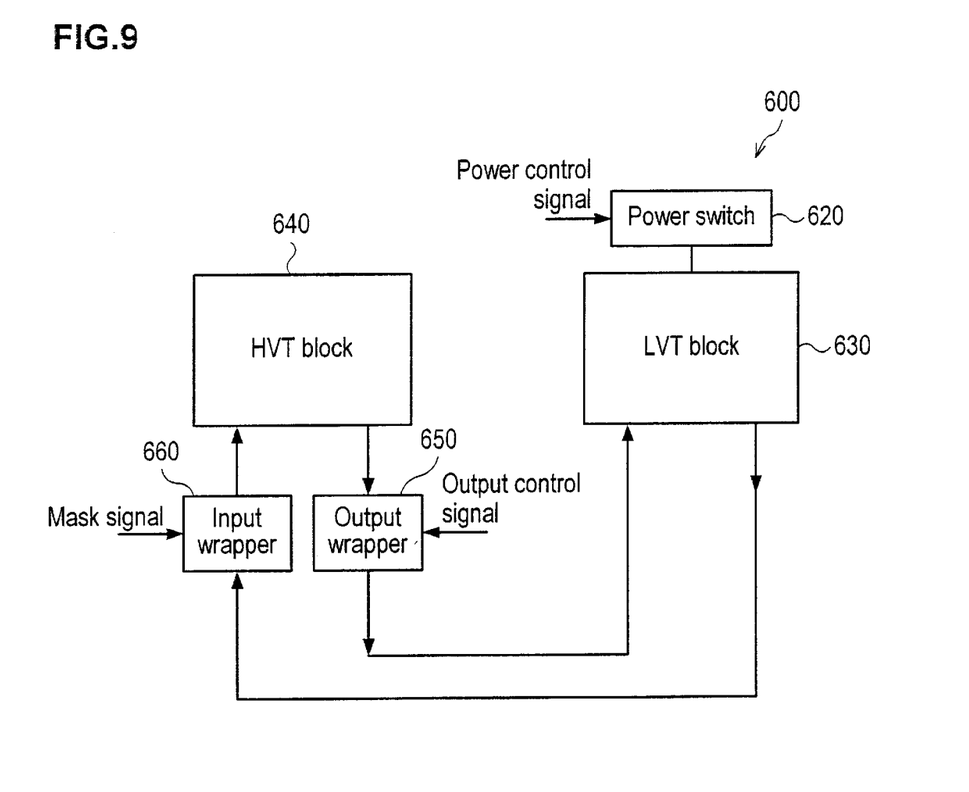
FIG. 9 is a block diagram of a semiconductor integrated circuit 600 in the sixth embodiment according to the present invention.

FIG. 9 is a block diagram of a semiconductor integrated circuit 600 in the sixth embodiment according to the present invention. As shown in FIG. 9, the semiconductor integrated circuit 600 has a power switch 620, an LVT block 630, an HVT block 640, an output wrapper 650 and an input wrapper 660.

The power switch 620 supplies power to the LVT block 630. The input wrapper 660 fixes the level of an input into the HVT block 640 when the LVT block is not actuated. The output wrapper 650 sets the level of an output from the HVT block 640 at a high impedance while the LVT block 630 is not actuated. By constituting the semiconductor integrated circuit 600 as stated above, it is possible to prevent the HVT block 640 from malfunctioning and to reduce current consumption in a power-down mode.

Figure 10:
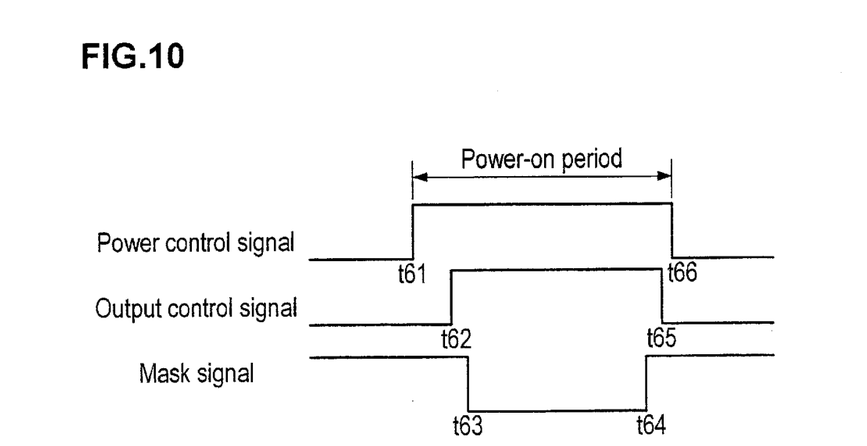
FIG. 10 shows a sequence for changing modes in the sixth embodiment according to the present invention.

Next, the operation of the semiconductor integrated circuit 600 will be described. FIG. 10 shows a sequence for changing modes. First, description will be given to a return operation from a power-down mode.

The power control signal of the power switch 620 is turned on to supply power to the LVT block 630 (at a time t61). The output control signal of the output wrapper 650 is turned on to output a signal level from the HVT block 640 (at a time t62).

If the LVT block 630 requires a reset operation, the reset operation is conducted. Then, the mask signal of the input wrapper 660 is turned off to allow an input signal to be received by the HVT block 640 (at a time t63). Following this, an ordinary operation is conducted.

Next, an operation for moving to the power-down mode will be described. The mask signal of the input wrapper 660 is turned on and the level of an input signal inputted into the HVT block 640 is fixed to a predetermined level (at a time t64).

The output control signal of the output wrapper 650 is turned off and an output from the HVT block 640 is set to have a high impedance (at a time t65). The power control switch of the power switch 620 is turned off to stop supplying power to the LVT block 630 (at a time t66).

By connecting the input wrapper 660 and the output wrapper 650, which operate as stated above, to the HVT block 640, it is possible to fix the level of the input into the HVT block 640 can be fixed to a predetermined level even in the power-down mode in which no power is supplied to the LVT block 630.

Furthermore, since the output signal from the HVT block 640 can be set to have a high impedance, it is possible to prevent the malfunction of the HVT block 640 which operates even in the power-down mode. Besides, since no current flows in an input section even if the input level of the HVT block 640 becomes a high impedance, it is possible to reduce current consumption. In addition, since this current may also serve as a trigger for latching up the LSI, it is possible to prevent latching up the LSI.

Seventh Embodiment

Figure 11:
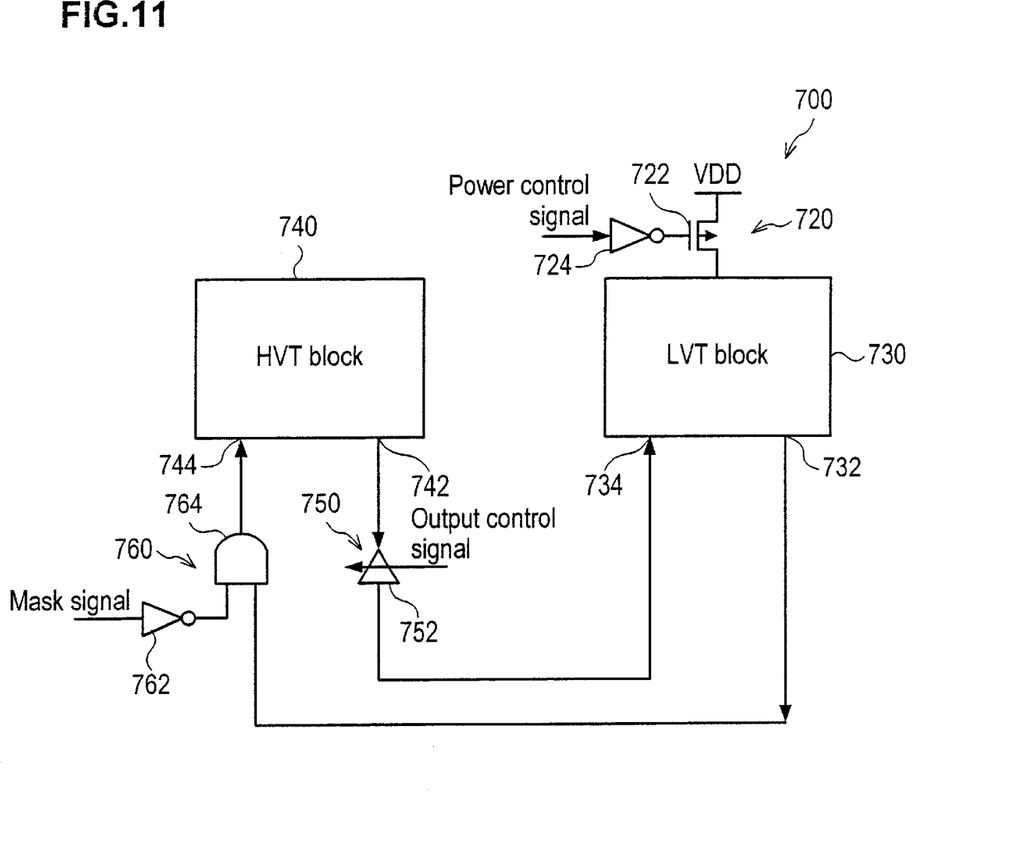
FIG. 11 is a block diagram of a semiconductor integrated circuit 700 in the seventh embodiment according to the present invention.

FIG. 11 is a block diagram of a semiconductor integrated circuit 700 in the seventh embodiment according to the present invention. As shown in FIG. 11, the semiconductor integrated circuit 700 has a power switch 720, an LVT block 730, an HVT block 740, an output wrapper 750 and an input wrapper 760. The schematic constitution of the semiconductor integrated circuit 700 is the same as that of the semiconductor integrated circuit 600 in the sixth embodiment.

In the semiconductor integrated circuit 700, the power switch 720 is constituted by a PMOS 722 and an inverter circuit 724, the input wrapper 760 to the HVT block 740 is constituted by a two-input AND gate 764 and an inverter circuit 762, and the output wrapper 750 from the HVT block 740 is constituted by a tri-state buffer 752. This constitution makes it possible to prevent the malfunction of the HVT block and to reduce current consumption in a power-down mode.

If the input wrapper 760 to the HVT block 740 is constituted by the two-input AND gate 764 and the inverter circuit 762 and a mask signal is turned on, then the level of an input into the HVT block 740 can be fixed to a GND level.

Further, if the output wrapper 750 from the HVT block 740 is constituted by the tri-state buffer 752 and an output control signal is turned off, then an output from the HVT block 740 has a high impedance. Thus, the seventh embodiment can obtain the same advantage as that of the sixth embodiment.

Eighth Embodiment

Figure 12:
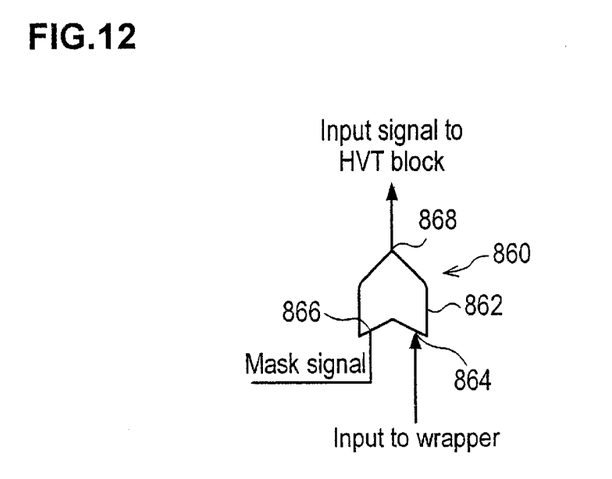
FIG. 12 shows an input wrapper 860 in the eighth embodiment according to the present invention.

FIG. 12 shows an input wrapper 860 in the eighth embodiment according to the present invention. In this embodiment, an input wrapper 860 constituted by a two-input OR gate 862 is employed instead of the input wrapper 760 to the HVT block 740 employed in the seventh embodiment.

Namely, an output from the output terminal 732 of the LVT block 730 is inputted into the input terminal 864 of the two-input OR gate 862 and a mask signal is inputted into the input terminal 866 thereof. Further, an output from the output terminal 868 of the two-input OR gate 862 is inputted into the input terminal 744 of the HVT block 740.

This embodiment is the same in constitution as the seventh embodiment except for the constitution of the input wrapper 860 of the HVT. Description will be, therefore, given only to that the input wrapper 860 of the HVT block can be constituted by the two-input OR gate 862.

If the input wrapper 860 to the HVT block 740 is constituted by the two-input OR gate 862 and a mask signal is turned on, then the level of an input into the HVT block 740 can be fixed to a VDD level. Due to this, it is possible to prevent the malfunction of the HVT block and to reduce current consumption in a power-down mode. Thus, by adopting the constitution of this embodiment, it is possible to obtain the same advantages as those of the sixth, seventh embodiments.

Further, for example, if the latching circuit 452 is employed instead of the input wrapper 860 in this embodiment, then the level of an input into the HVT block can be fixed to a final level before power-down mode. Due to this, it is possible to obtain the same advantages as those of the sixth, seventh, and eighth embodiments.

Ninth Embodiment

Figure 13:
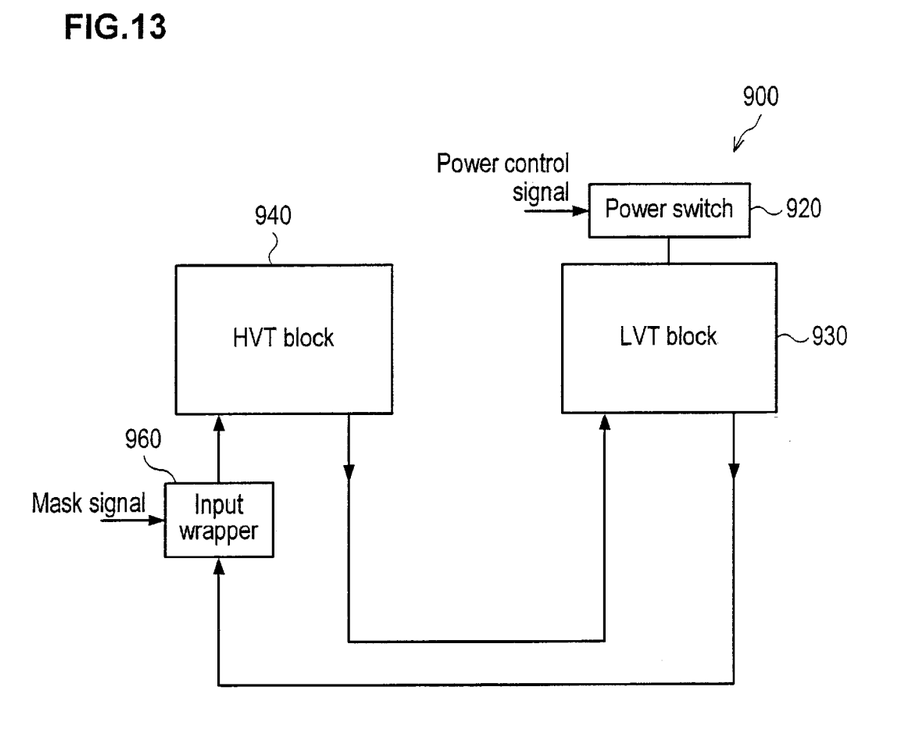
FIG. 13 is a block diagram of a semiconductor integrated circuit 900 in the ninth embodiment according to the present invention.

FIG. 13 is a block diagram of a semiconductor integrated circuit 900 in the ninth embodiment according to the present invention. As shown in FIG. 13, the semiconductor integrated circuit 900 has a power switch 920, an LVT block 930, an HVT block 940 and an input wrapper 960.

The semiconductor integrated circuit 900 in this embodiment is the same in constitution as that in the seventh embodiment except that it is not necessary to control the output wrapper from the HVT block 940. Description will be, therefore, given only to the reason the output wrapper from the HVT block 940 can be dispensed with.

It is assumed that the state of the input pin of the LVT block 930 is a so-called insulated state in which the input pin is not electrically connected to a power supply line. In a state in which the supply of power to the LVT block 930 is stopped, even if a signal level is applied to the input pin of the LVT block 930, such problems as latching up the integrated circuit and the increase of current consumption do not occur. This is because the input pin is not electrically connected to the power supply line. Therefore, if the above conditions are met, it is possible to dispense with the output wrapper from the HVT block 940 and to obtain the same advantage as that of the seventh embodiment.

Here, it is possible to employ the circuit arrangements as shown in, for example, the seventh and eighth embodiments for the power switch 920 and the input wrapper 960.

The preferred embodiments of the semiconductor integrated circuit according to the present invention have been described so far with reference to the accompanying drawings. The present invention should not be, however, limited to these embodiments. Those skilled in the art would obviously reach various changes and modifications within the scope of the technical concept defined in claims which follow and appreciate that these changes and modifications naturally fall within the technical scope of the present invention.

For example, in the embodiments stated above, the input wrapper and the output wrapper are provided in the same block. They are not necessarily provided in the same block. In addition, the circuit arrangements of the power switch, the input wrapper and the output switch should not be limited to the examples shown in the second, third, fourth, seventh and eighth embodiments. Any arrangements having the same functions can be employed for these switches.

As stated so far, the present invention can realize low current consumption and can prevent the malfunction of the HVT block in a power-down mode in the LSI circuit having a mixture of the HVT block and the LVT block.

What is claimed is:

1. A semiconductor integrated circuit having a mixture of elements having different threshold voltages, comprising:

a controller that controls power supplied to a block constituted by an element having a low threshold voltage; and a fixing circuit that fixes a level of an output signal from the block constituted by the element having said low threshold voltage to a predetermined level when no power is supplied to the block constituted by the element having said low threshold voltage, wherein the level of said output signal is any one of a ground potential (GND) level, a power supply potential (VDD) level, such a level as to hold a value output just before supply of power to the block constituted by the element having said low threshold voltage is stopped, or a level having high impedance.

2. The semiconductor integrated circuit of claim 1, further comprising:

a second fixing circuit that fixes a level of an input voltage inputted into the block constituted by the element having said low threshold voltage to a predetermined level when no power is supplied to the block constituted by the element having said low threshold voltage, wherein said second fixing circuit sets the block constituted by the element having said low threshold voltage to have a high impedance level.

3. A semiconductor integrated circuit having a mixture of elements having different threshold voltages, comprising:

a controller that controls power supplied to a block constituted by an element having a low threshold voltage; and a fixing circuit that fixes a level of an input voltage inputted into a block constituted by an element having a high threshold voltage to a predetermined level when no power is supplied to the block constituted by the element having said low threshold voltage, wherein the level of said input voltage is any one of a ground potential (GND) level, a power supply potential (VDD) level, such a level as to hold a value output just before supply of power to the block constituted by the element having said low threshold voltage is stopped, or a level having high impedance.

4. The semiconductor integrated circuit according to claim 3, further comprising:

a second fixing circuit that fixes a level of an output signal from the block constituted by the element having said high threshold voltage to a predetermined level when no power is supplied to the block constituted by the element having said low threshold voltage, wherein said second fixing circuit sets the block constituted by the element having said low threshold voltage to have a high impedance level.

* * * * *